United States Patent
Saitoh

(10) Patent No.: US 6,912,696 B2
(45) Date of Patent: Jun. 28, 2005

(54) SMART CARD AND CIRCUITRY LAYOUT THEREOF FOR REDUCING CROSS-TALK

(75) Inventor: Kazutaka Saitoh, Miyzaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 305 days.

(21) Appl. No.: 09/729,080

(22) Filed: Dec. 5, 2000

(65) Prior Publication Data

US 2002/0069392 A1 Jun. 6, 2002

(51) Int. Cl.[7] .................. G06F 17/50; G11C 11/00; G11C 5/02; H01L 29/40
(52) U.S. Cl. .................. 716/1; 257/758; 257/773; 365/51; 365/158
(58) Field of Search .................. 716/1; 257/758, 257/773; 365/158, 51

(56) References Cited

U.S. PATENT DOCUMENTS

| | | | | | |
|---|---|---|---|---|---|
| 5,512,507 A | * | 4/1996 | Yang et al. | ................. | 438/598 |
| 5,777,360 A | * | 7/1998 | Rostoker et al. | ............ | 257/315 |
| 5,864,496 A | * | 1/1999 | Mueller et al. | ................ | 365/69 |
| 6,236,587 B1 | * | 5/2001 | Gudesen et al. | ............ | 365/105 |
| 6,261,956 B1 | * | 7/2001 | Shields | ........................ | 438/689 |
| 6,483,740 B1 | * | 11/2002 | Spitzer et al. | .............. | 365/158 |
| 2002/0131289 A1 | * | 9/2002 | Thompson et al. | ........... | 365/51 |

OTHER PUBLICATIONS

K. Shelfer et al., Smart Card Evolution, Communications of the ACM, Jul. 2002, pp. 83–88.*

A. Leung, Smart Cards Seem A Sure Bet. InfoWorld.com [online] (Mar. 8, 1999) [retrieved on Aug. 13, 2002]. Retrieved from Internet <www.InfoWorld.com/cgi–bin/display/spotlight.htm.*

* cited by examiner

*Primary Examiner*—A. M. Thompson
(74) *Attorney, Agent, or Firm*—Volentine Francos & Whitt, PLLC

(57) ABSTRACT

A semiconductor integrated circuit includes a ROM having bit lines extending in a first direction in a first layer. A conductive line is arranged in a second layer above the first layer, extending in a second direction, which is orthogonal to the first direction, across the bit lines. The conductive line is shaped to be a step form having a part extending in the first direction.

14 Claims, 5 Drawing Sheets

US 6,912,696 B2

SMART CARD AND CIRCUITRY LAYOUT THEREOF FOR REDUCING CROSS-TALK

TECHNICAL FIELD OF THE INVENTION

The present invention relates to small size cards, such as smart cards and chip cards; and more particularly, to a design of conductive lines arranged over bit lines of a ROM block.

BACKGROUND OF THE INVENTION

Smart or chip cards are very frequently used in applications, e.g. banking, requiring a high level of security against fraudulent use.

Usually, a smart card component is an integrated circuit having a read-only memory or (ROM), an erasable programmable read-only memory or (EPROM), a central processor or (CPU) and a random access memory or (RAM). It can incorporate an electrically erasable programmable read-only memory or (EEPROM). The CPU is a member of the microprocessor type using a runnable program fixed at the time of the manufacture of the component in the ROM, as well as data entered in the EPROM during the different stages, e.g. personalization, which follow the manufacture of the component and extend up to the delivery of the card to the customer. The RAM enables the CPU to enter and use temporary data during its operation. It is erased when the card is no longer energized.

A conventional ROM includes bit lines arranged to extend a first direction, which is a vertical direction in the figure. The bit lines are formed in a first layer. In a second layer located above the first layer, conductive lines are formed to extend parallel to the bit lines. According to the conventional ROM layout, a cross-talk phenomenon occurs at regions where the bit line and conductive line are overlapped. As a result, the ROM may not operate properly. In the ROM, a pre-charged level is decreased to "L" level; and therefore, "H" data may misread as "L" data.

OBJECTS OF THE INVENTION

Accordingly, an object of the present invention is to provide a semiconductor integrated circuit in which the possibility of cross-talk phenomenon on a ROM is reduced.

Another object of the present invention is to provide a smart card which is designed so as to operate reliably by reducing the possibility of cross-talk phenomenon on a ROM.

Further object of the present invention is to provide a method for designing a semiconductor integrated circuit in which the possibility of cross-talk phenomenon on a ROM is reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor integrated circuit includes a ROM having bit lines extending in a first direction in a first layer; and a conductive line arranged in a second layer located above the first layer so as to extend in a second direction, which is orthogonal to the first direction, across the bit lines.

According to a second aspect of the present invention, a smart card includes a ROM; a CPU using a runnable program fixed at the time of the manufacture of the component in the ROM; and a RAM enables the CPU to enter and use temporary data during its operation. The ROM has bit lines extending in a first direction in a first layer; and a conductive line arranged in a second layer above the first layer so as to extend in a second direction, which is orthogonal to the first direction, across the bit lines.

According to a third aspect of the present invention, a method for designing a semiconductor integrated circuit according to claim 1, includes the steps of: providing bit lines for a ROM extending in a first direction in a first layer; providing conductive line arrangement in a second layer above the first layer by an automatic design technique; and rearrange the conductive line by a manual design technique so that the conductive line extends in a second direction, which is orthogonal to the first direction, across the bit lines.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
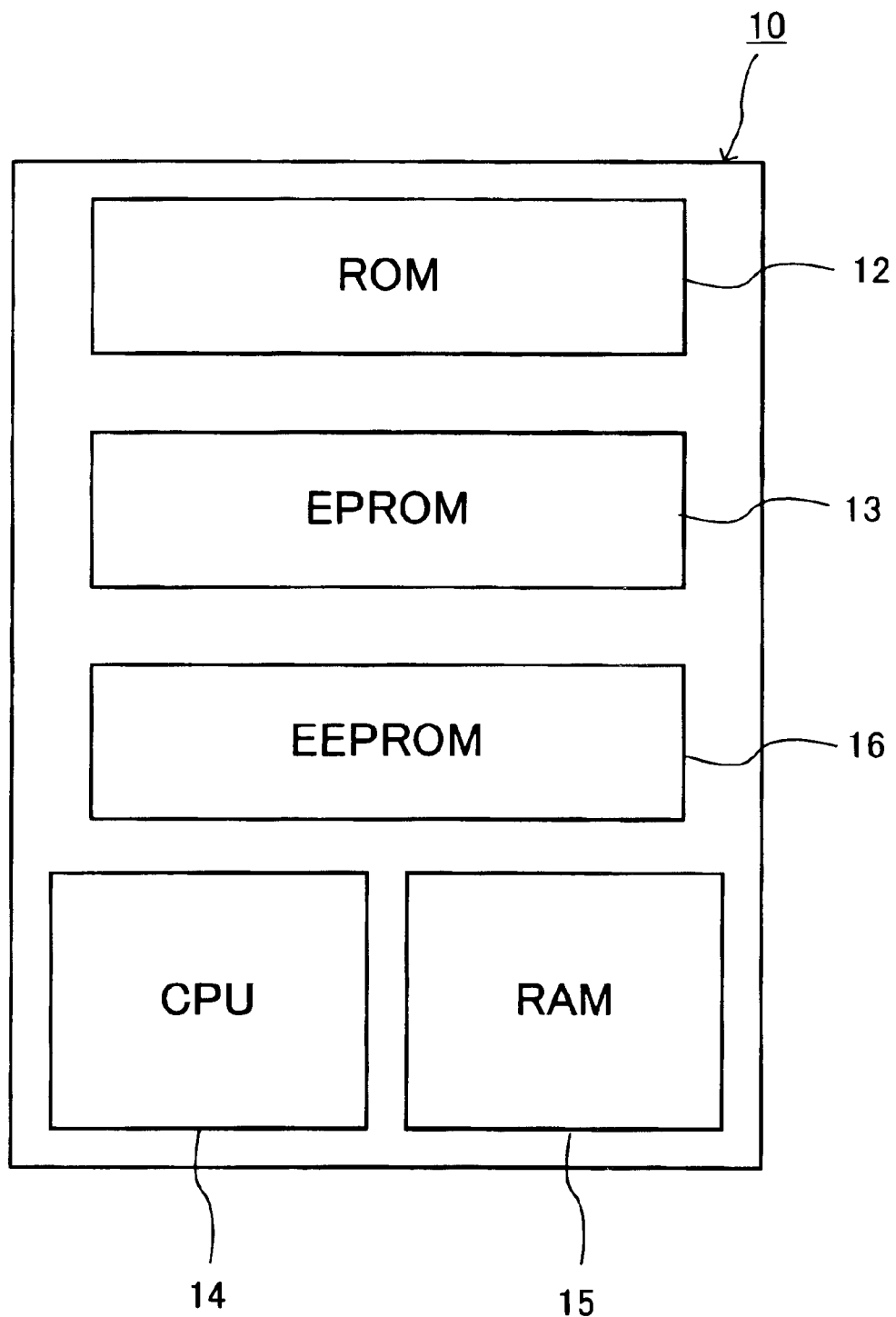
FIG. 1 the diagram of a component for a smart card.

The invention is described in greater detail hereinafter relative to a non-limitative embodiment and with reference to the attached drawings, wherein show:

The smart card component 10 shown in FIG. 1 is an integrated circuit having in the present embodiment a read-only memory or (ROM) 12, an erasable programmable read-only memory or (EPROM) 13, a central processor or (CPU) 14 and a random access memory or (RAM) 15. It can incorporate an electrically erasable programmable read-only memory or (EEPROM) 16. This device is known and the connections between these different parts are not shown. The CPU (14) is a member of the microprocessor type using a runnable program fixed at the time of the manufacture of the component in the ROM 12, as well as data entered in the EPROM 13 during the different stages, e.g. personalization, which follow the manufacture of the component and extend up to the delivery of the card to the customer. The RAM 15 enables the CPU 14 to enter and use temporary data during its operation. It is erased when the card is no longer energized.

Figure 2:
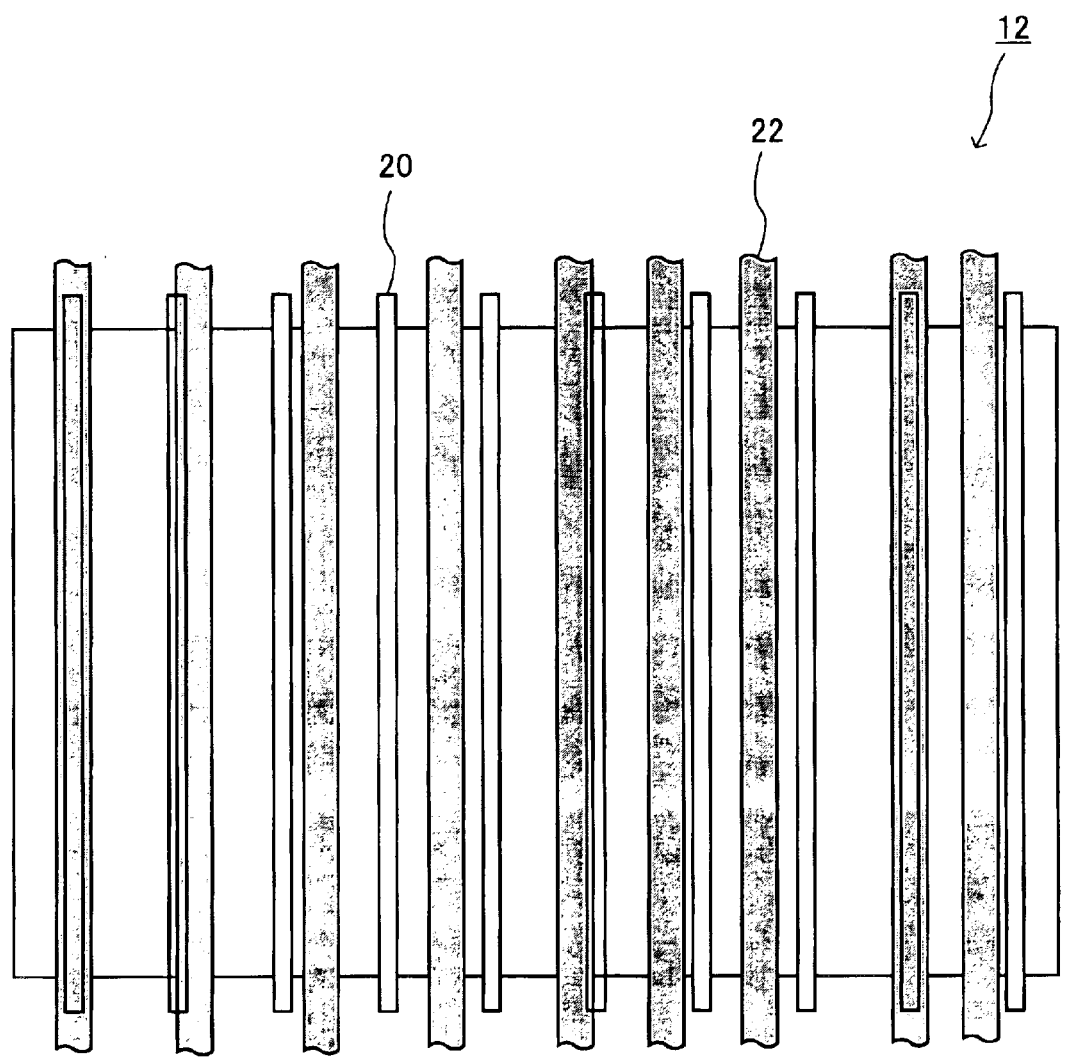
FIG. 2 is a conventional ROM layout in a smart card.

FIG. 2 is a conventional ROM layout in a smart card. A ROM includes bit lines 20 arranged to extend in a first direction, which is a vertical in the figure. The bit lines 20 are formed in a first layer. In a second layer located above the first layer, conductive lines 22 are formed to extend parallel to the bit lines 20. According to the conventional ROM layout 12, shown in FIG. 2, a cross-talk phenomenon occurs at regions where the bit line 20 and conductive line 22 are overlapped. As a result, the ROM may not operate properly.

Figure 3:
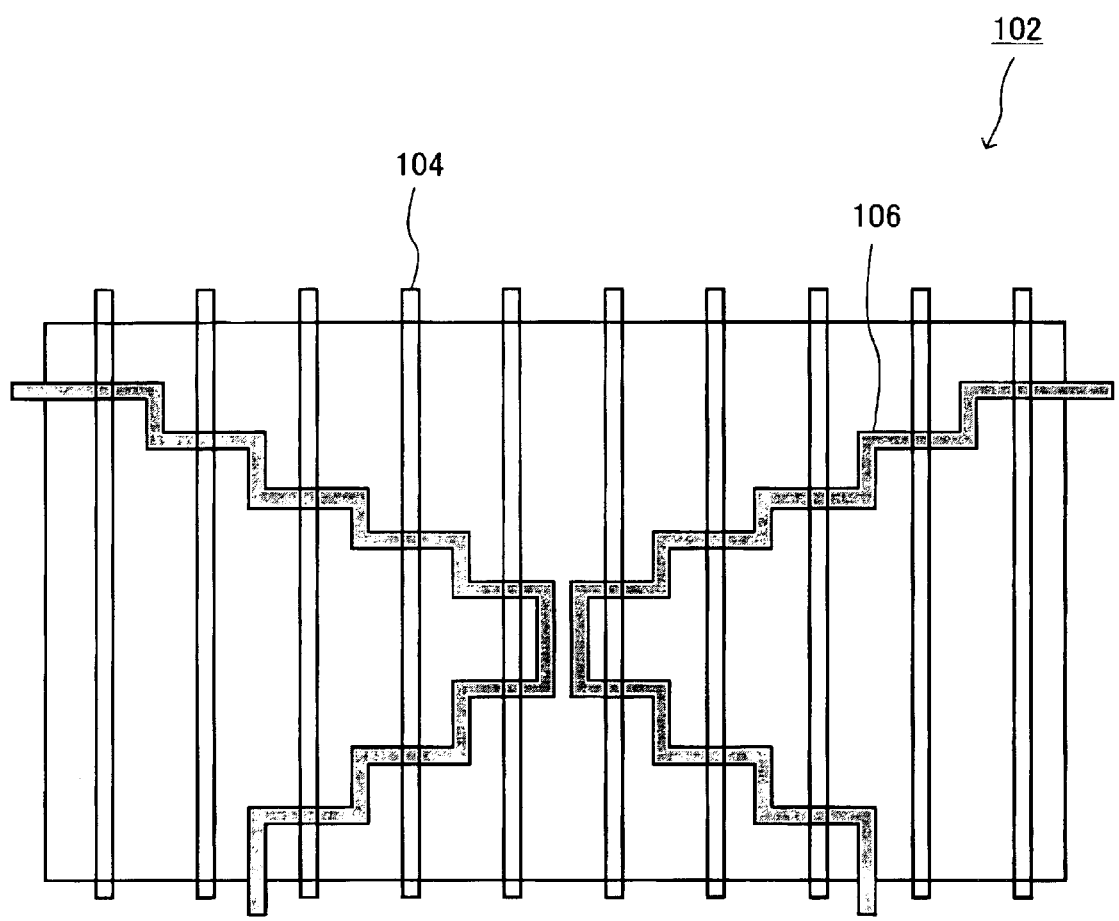
FIG. 3 is a ROM layout in a smart card according to a first embodiment of the present invention.

FIG. 3 is a circuitry layout 102 in a smart card according to a first embodiment of the present invention. A ROM includes bit lines 104 arranged to extend in a first direction, which is a vertical in the figure. The bit lines 104 are formed in a first layer. In a second layer located above the first layer, conductive lines 106 are formed to extend in a second direction, which is orthogonal to the first direction. Each of the conductive lines 106 is shaped to be a step form so as to across the bit lines 104 as much as possible and to improve the degree of freedom of circuitry design. In other words, the conductive lines 106 can extend in any direction at the ends, so that the semiconductor integrated circuit can be designed without a lot of restrictions.

In the first embodiment, shown in FIG. 3, two of the conductive lines 106 are arranged in line symmetry right and left. Each of the conductive lines 106 has two ends extending toward upper and lower portions of a ROM block or ROM region 102, respectively.

In fabrication, original conductive lines are designed by an automatic design technique using computer software, just like as shown in FIG. 2. Next, the original conductive lines are rearranged by a manual operation to provided a desired conductive line arrangement, as shown in FIG. 3.

According to the smart card of the first embodiment, the possibility of a cross-talk phenomenon is decreased. Even if a cross-talk phenomenon occurs, the phenomenon is dispersed on the ROM circuitry, because each of the conductive lines 106 extends across a large number of bit lines 104. Therefore, the ROM operates more properly and reliably.

Figure 4:
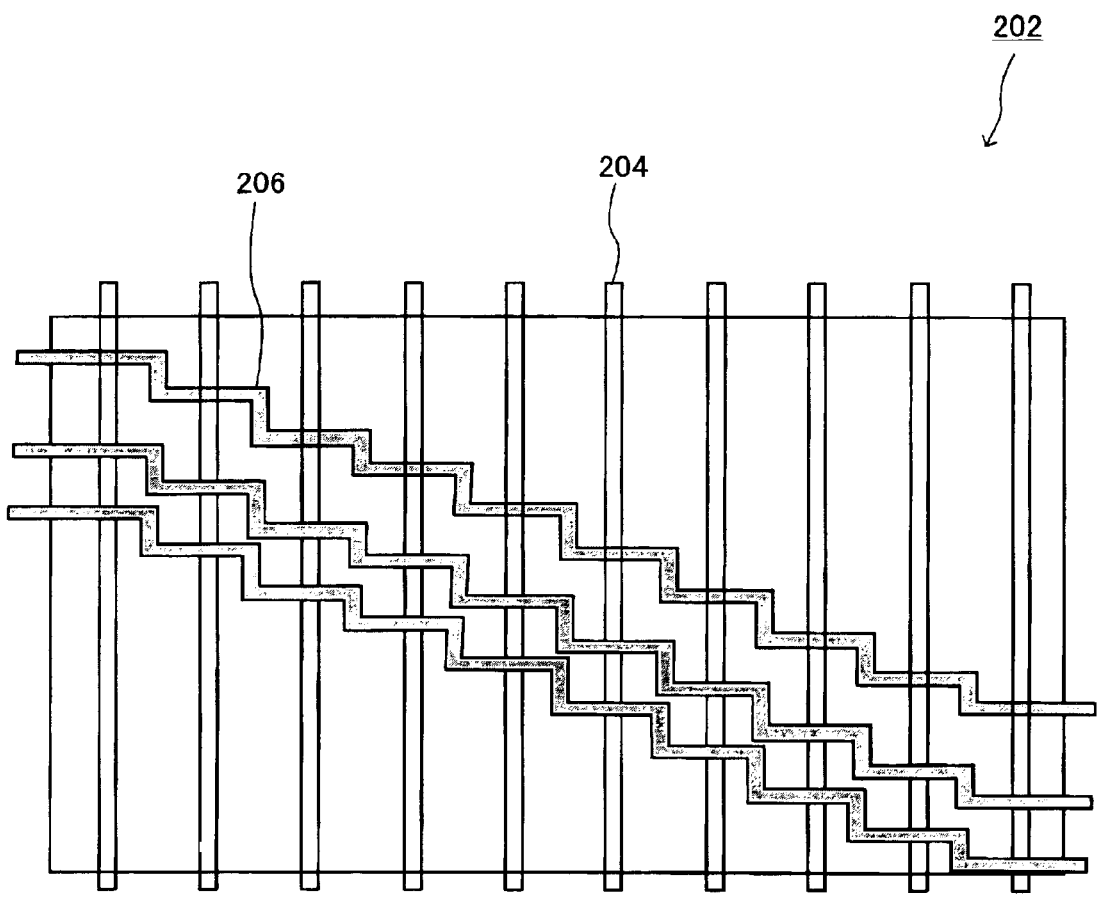
FIG. 4 is a ROM layout in a smart card according to a second embodiment of the present invention.

FIG. 4 is another circuitry layout in a smart card according to a second embodiment of the present invention. A ROM includes bit lines 204 arranged to extend in a first direction, which is a vertical in the figure. The bit lines 204 are formed in a first layer. In a second layer located above the first layer, conductive lines 206 are formed to extend in a second direction, which is orthogonal to the first direction. Each of the conductive lines 206 is shaped to be a step form so as to across the bit lines 204 as much as possible and to improve the degree of freedom of circuitry design. In other words, the conductive lines 206 can extend any directions at the ends, so that the semiconductor integrated circuit can be designed without a lot of restrictions.

In the second embodiment, shown in FIG. 4, all of the conductive lines 206 are arranged in parallel to each other top and bottom. Each of the conductive lines 206 has two ends extending toward an right upper portion and a left lower portion of a ROM block or ROM region 202, respectively.

In fabrication, original conductive lines are designed by an automatic design technique using computer software, just like as shown in FIG. 2. Next, the original conductive lines are rearranged by a manual operation to provided a desired conductive line arrangement, as shown in FIG. 4.

According to the smart card of the second embodiment, the possibility of a cross-talk phenomenon is decreased. Even if a cross-talk phenomenon occurs, the phenomenon is dispersed on the ROM circuitry, because each of the conductive lines 206 extends across a large number of bit lines 204. Therefore, the ROM operates more properly and reliably.

Figure 5:
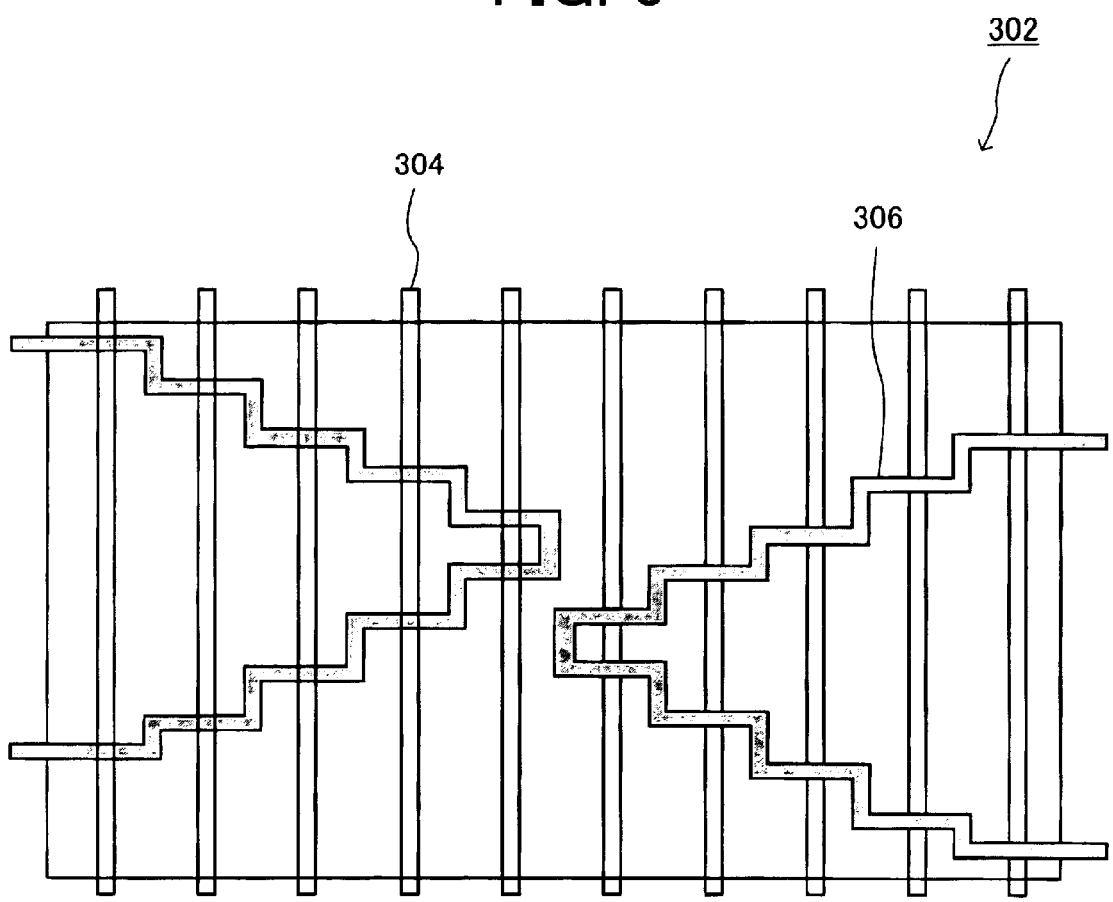
FIG. 5 is a ROM layout in a smart card according to a third embodiment of the present invention.

FIG. 5 is another circuitry layout in a smart card according to a third embodiment of the present invention. A ROM includes bit lines 304 arranged to extend in a first direction, which is a vertical in the figure. The bit lines 304 are formed in a first layer. In a second layer located above the first layer, conductive lines 306 are formed to extend in a second direction, which is orthogonal to the first direction. Each of the conductive lines 306 is shaped to be a step form so as to across the bit lines 304 as many as possible and to improve the degree of freedom of circuitry design. In other words, the conductive lines 306 can extend any directions at the ends, so that the semiconductor integrated circuit can be designed without a lot of restrictions.

In the second embodiment, shown in FIG. 5, each of the conductive lines 306 has two ends both extending toward the same side of a ROM block or ROM region 302.

In fabrication, original conductive lines are designed by an automatic design technique using computer software, just like as shown in FIG. 2. Next, the original conductive lines are rearranged by a manual operation to provided a desired conductive line arrangement, as shown in FIG. 4.

According to the smart card of the second embodiment, the possibility of a cross-talk phenomenon is decreased. Even if a cross-talk phenomenon occurs, the phenomenon is dispersed on the ROM circuitry, because each of the conductive lines 206 extends across a large number of bit lines 204. Therefore, the ROM operates more properly and reliably.

What is claimed is:

1. A semiconductor integrated circuit, comprising:
   a ROM having bit lines extending in a first direction in a first layer; and
   a conductive line arranged in a second layer, located above the first layer, said conductive line comprising:
   a first portion of said conductive line extending in a first direction, which is parallel to the bit lines, wherein said first portion does not cross said bit lines; and a second portion that extends in a second direction, which is orthogonal to the first direction, and said second portion passes across the bit lines at a plurality of locations.

2. A semiconductor integrated circuit, according to claim 1, wherein
   the conductive line has two ends extending toward upper and lower portions of the ROM block, respectively.

3. A semiconductor integrated circuit, as recited in claim 2, wherein one of the two ends of the conductive line is arranged adjacent an upper portion of a side face of the ROM block, and the other of the two ends of the conductive line is arranged at the bottom face of the ROM block, and wherein the side face and the bottom face are orthogonal to one another.

4. A smart card, comprising:
   a ROM;
   a CPU using a runnable program fixed at the time of the manufacture of the component in the ROM; and
   a RAM enabling the CPU to enter and use temporary data during its operation, wherein the ROM has bit lines extending in a first direction in a first layer; and a conductive line arranged in a second layer, located above the first layer, the conductive line partially extending in a second direction, which is orthogonal to the first direction, to pass across the bit lines, wherein
   the conductive line has two ends extending toward a left upper portion and a right lower portion of a ROM block, respectively.

5. A smart card according to claim 4, wherein the two ends both extend toward the same side of a ROM block.

6. A method for designing a semiconductor integrated circuit, the method comprising the steps of:
   providing bit lines for a ROM extending in a first direction in a first layer;

providing a conductive line arrangement in a second layer, located above the first layer, by an automatic design technique; and rearranging the conductive line by a manual design technique so that a first portion of said conductive line extends in a first direction, which is parallel to the bit lines, and said first portion does not cross said bit lines; and so a second portion extends in a second direction, which is orthogonal to the first direction, and said second portion passes across the bit lines at a plurality of locations.

7. A method according to claim 6, wherein the conductive line is shaped to be a step form having a part extending in the first direction.

8. A method according to claim 6, wherein the conductive line is shaped so as to pass across the bit lines two or more times.

9. A method according to claim 6, wherein the conductive line has two ends extending toward upper and lower portions of a ROM block, respectively.

10. A method according to claim 6, wherein the conductive line has two ends extending toward a left upper portion and a right lower portion of the ROM block, respectively.

11. A method according to claim 6, wherein the conductive line has two ends both extending toward the same side of the ROM block.

12. A semiconductor integrated circuit, comprising:

a ROM having bit lines extending in a first direction in a first layer; and a conductive line arranged in a second layer, located above the first layer, wherein the conductive line partially extends in a second direction, which is orthogonal to the first direction, to pass across the bit lines, and is shaped to be a step form having a part extending in the first direction wherein the conductive line has two ends extending toward a left upper portion and a right lower portion of a ROM block, respectively.

13. A smart card according to claim 12, wherein the conductive line has two ends extending toward upper and lower portions of a ROM block, respectively.

14. A semiconductor integrated circuit, comprising:

a ROM having bit lines extending in a first direction in a first layer; and a conductive line arranged in a second layer, located above the first layer, wherein the conductive line partially extends in a second direction, which is orthogonal to the first direction, to pass across the bit lines, and is shaped to be a step form having a part extending in the first direction, wherein the conductive line has two ends both extending toward the same side of a ROM block.

* * * * *